(12) United States Patent
Honda

(10) Patent No.: US 6,787,846 B2
(45) Date of Patent: Sep. 7, 2004

(54) TRANSISTOR

(75) Inventor: Tatsuya Honda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/377,606

(22) Filed: Mar. 4, 2003

(65) Prior Publication Data

US 2003/0168699 A1 Sep. 11, 2003

(30) Foreign Application Priority Data

Mar. 5, 2002 (JP) ........................................ 2002-058541

(51) Int. Cl.[7] .............................................. H01L 29/76
(52) U.S. Cl. ........................................ 257/327; 257/288
(58) Field of Search .................................. 257/288, 327

(56) References Cited

U.S. PATENT DOCUMENTS

| | | |
|---|---|---|
| 4,571,584 A | 2/1986 | Suzuki |
| 4,769,639 A | 9/1988 | Kawamura et al. |
| 4,922,240 A | 5/1990 | Duwaer |
| 5,159,260 A | 10/1992 | Yoh et al. |
| 5,250,931 A | 10/1993 | Misawa et al. |
| 5,365,250 A | 11/1994 | Hirashima |
| 5,409,850 A * | 4/1995 | Tsuji ........................... 438/164 |
| 5,559,526 A | 9/1996 | Izawa |
| 5,570,105 A | 10/1996 | Koyama |
| 5,574,474 A | 11/1996 | Tamanoi |
| 5,574,475 A | 11/1996 | Callahan, Jr. et al. |
| 5,625,208 A | 4/1997 | Jun |
| 5,646,643 A | 7/1997 | Hirai et al. |
| 5,663,918 A | 9/1997 | Javanifard et al. |
| 5,666,133 A | 9/1997 | Matsuo et al. |
| 5,680,149 A | 10/1997 | Koyama et al. |
| 5,689,280 A | 11/1997 | Asari et al. |
| 5,712,652 A | 1/1998 | Sato et al. |
| 5,808,595 A | 9/1998 | Kubota et al. |
| 5,899,547 A | 5/1999 | Yamazaki et al. |
| 5,956,011 A | 9/1999 | Koyama et al. |
| 6,037,924 A | 3/2000 | Koyama et al. |
| 6,369,404 B1 * | 4/2002 | Kane ........................... 257/14 |

FOREIGN PATENT DOCUMENTS

| | | |
|---|---|---|
| JP | 07-263691 | 10/1995 |
| JP | 10-200123 | 7/1998 |

* cited by examiner

Primary Examiner—Allan R. Wilson
(74) Attorney, Agent, or Firm—Fish & Richardson P.C.

(57) ABSTRACT

A field effect transistor is provided in which a drain current is not influenced by fluctuation of a gate voltage. In order to set the transistor in an on state (conductive state), a voltage equal to or more than a threshold voltage is applied to an inversion layer formation region (19) via a gate electrode (12) to thereby form an inversion layer. Charge inducted by the inversion layer moves to a channel region (18) and make the Fermi level of the channel region (18) fluctuate, and then, a potential barrier between a source region (16) and the channel region (18) is lowered. As a result, carriers can climb over the barrier and move from the source region (16) to a drain region (17), and thus, a drain current flows.

12 Claims, 6 Drawing Sheets

FIG. 2A  y-y' SECTIONAL VIEW    x-x' SECTIONAL VIEW
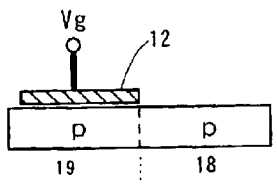
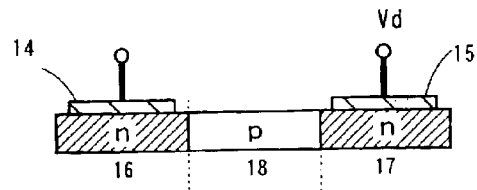
FIG. 2B  [Vg=0V, Vd=0V]
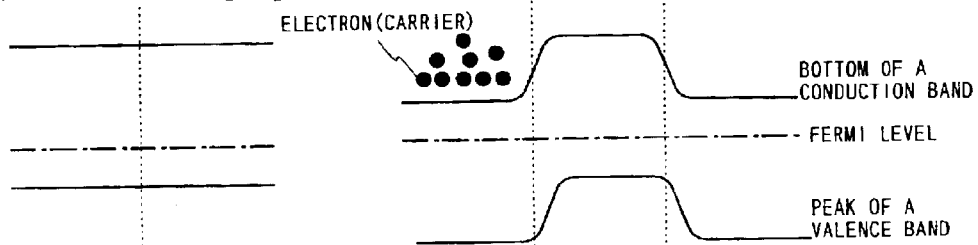
FIG. 2C  [Vg>Vth>0V, Vd>0V]
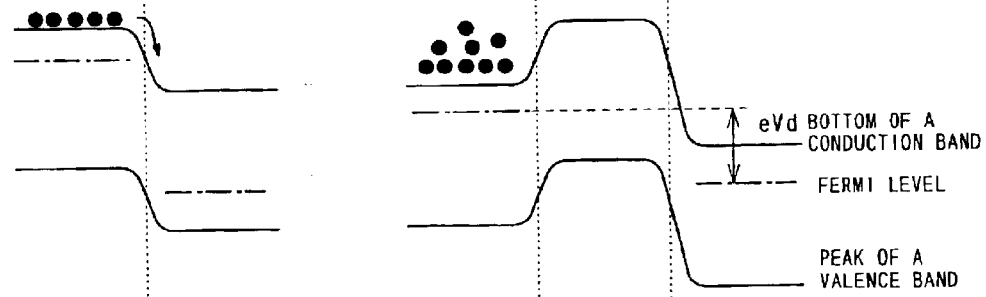
FIG. 2D
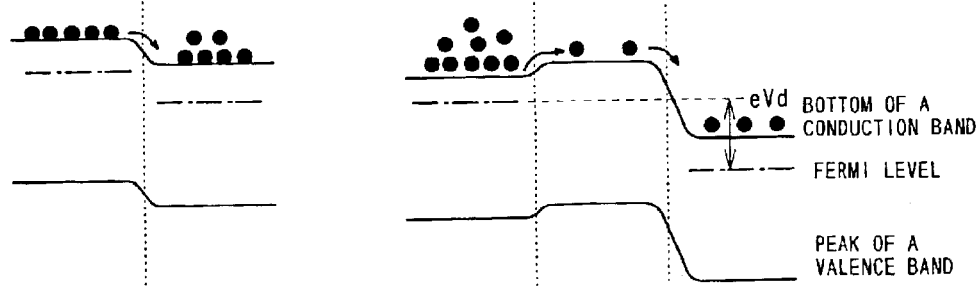

Id-Vg characteristics

TRANSISTOR

BACKGROUND OF THE INVENTION

1. Field of the Invention

The present invention relates to a transistor provided with an amplifying function and a switching function, and to an integrated circuit using the transistor.

2. Related Background Art

Transistors are roughly classified into two types: a bipolar transistor that operates with actions of carriers of both an electron and a hole; and a unipolar transistor that operates with an action of a carrier of either an electron or a hole.

For example, as to a field effect transistor, a voltage is applied to a semiconductor through a gate electrode through a gate insulating film to induce charge in an interface between the gate insulating film and the semiconductor, thereby forming an inversion layer (channel) on a surface of the semiconductor, and thus, electrical conduction is established between a source and a drain. That is, the resistance of the semiconductor is changed due to a gate voltage to thereby change a current that flows between the source and the drain.

As described above, the field effect transistor is made to operate by making the Fermi level of the semiconductor fluctuate due to the gate voltage. Thus, when the voltage applied to the gate electrode fluctuates, the current that flows through the transistor inevitably fluctuates under the operation principle.

Further, when the field effect transistor is in a conductive state (on state), an electric field perpendicular to a channel length direction (moving direction of carriers) is formed in the channel due to the gate voltage. However, the electric field in such a perpendicular direction is one of serious causes of hot carrier injection to the gate insulating film.

When injected into the gate insulating film, hot carriers are trapped by the gate insulating film to form a trapping level, or disconnect bonding of the interface between the gate insulating film and the semiconductor layer to form an interface level, which causes fluctuation in a threshold voltage of the transistor. When the threshold voltage fluctuates, for example, a timing of switching of the transistor varies, or a drain current fluctuates, which becomes a cause of malfunction of a circuit.

SUMMARY OF THE INVENTION

The present invention has been made in view of the above, and therefore has an object to provide a transistor in which a current that flows between a source and a drain can be kept constant even though a gate voltage is changed and which is based on the operation principle different from that in a conventional transistor.

Further, the present invention has another object to eliminate deterioration due to hot carrier injection.

A transistor according to the present invention includes: a semiconductor layer provided with a source region, a drain region, and a channel region that serves as a path of a current (carriers) between the source region and the drain region; an insulating film functioning as a gate insulating film that contacts with the semiconductor layer; and a gate electrode that overlaps with the semiconductor layer through the insulating film, and is characterized in that: another semiconductor region that contacts with the channel region is provided in the semiconductor layer; and the gate electrode is provided so as not to overlap with the channel region but to overlap with the semiconductor layer and so as to overlap with the semiconductor region that contacts with the channel region.

That is, in the transistor according to the present invention, the gate electrode is provided so as not to apply a gate voltage to the channel region provided in the semiconductor layer, and the semiconductor region (inversion layer formation region) for forming an inversion layer due to an electric field of the gate electrode is provided in the semiconductor layer so as to contact with the channel formation region.

Further, in the transistor according to the present invention, a semiconductor that constitutes the semiconductor layer of the transistor is formed of a semiconductor of a single element such as Si or Ge, a compound semiconductor made of GaAs, InP, SiC, ZnSe, or GaN, or a semiconductor formed of mixed crystal such as SiGe or $Al_xGa As_{1-x}$. Further, the crystalline structure of the semiconductor may be any of a monocrystalline structure, polycrystalline structure, microcrystalline structure, and amorphous structure.

For example, a silicon wafer, an amorphous silicon film deposited by a CVD method, a sputtering method, or the like, or a polycrystalline silicon film obtained by crystallizing such an amorphous silicon film can be used as the semiconductor layer.

Further, the regions such as the channel region and the source region which are formed in the semiconductor layer, are each imparted with an appropriate conductivity type in accordance with the conductivity type of the transistor (n-channel type or p-channel type) although this is described later.

In the case where the semiconductor that constitutes the semiconductor layer is formed of silicon or germanium, as a dopant added into the semiconductor layer for imparting conductivity, an impurity that functions as an acceptor, such as B (boron), Sn, or Al, is added in the case of forming a p-type semiconductor region while an impurity that functions as a donor, such as P (phosphorous), As, or Sb is added in the case of forming an n-type semiconductor region.

The transistor according to the present invention which has the above-described structure is the same as a field effect transistor in the point that: a voltage is applied to the semiconductor via the gate electrode through the gate insulating film to induce carriers (electrons or holes) on the semiconductor surface due to electrostatic induction; and the transistor is made to operate with the action of carriers that are either electrons or holes.

However, the completely different point of the transistor according to the present invention from the conventional field effect transistor is that the gate voltage is applied not to the channel region but to the semiconductor region that contacts with the channel region through the gate insulating film to induce carriers, thereby forming the inversion layer.

In order to set the transistor according to the present invention in an on state (conductive state), a voltage equal to or more than a threshold voltage is applied to the semiconductor region via the gate electrode to thereby form the inversion layer.

Charge induced by the inversion layer moves to the channel region. As a result, the Fermi level of the channel region moves so that a potential barrier between the source region and the channel region becomes low. Then, the charge can climb over the barrier and move from the source region to the drain region, and thus, a drain current flows.

As described above, the transistor according to the present invention can operate in the same manner as the conventional transistor although this is described below in detail. Further, the transistor according to the present invention can be applied to various integrated circuits in which a conventional MOS transistor or thin film transistor is used. For example, the transistor according to the present invention can be applied to various integrated circuits such as memories like an SRAM and a DRAM, a processing circuit, and an image sensor using a CMOS transistor.

In addition, the transistor according to the present invention can now be applied to an active matrix display using liquid crystal or organic electroluminescence in which a TFT is used.

Further, as described above, the transistor according to the present invention does not have a characteristic that the charge is induced on the semiconductor surface due to the electric field to form the inversion layer (channel), thereby lowering the barrier between the source region and the channel region, but has a characteristic that carriers are injected into the channel region from the outside to change the Fermi level of the channel region, thereby lowering the barrier between the source region and the channel region.

Accordingly, in the present invention, the barrier between the source region and the channel region does not influence fluctuation of the gate voltage, and thus, the drain current does not fluctuate even though the gate voltage fluctuate, and is kept constant.

BRIEF DESCRIPTION OF THE DRAWINGS

In the accompanying drawings:

FIGS. 2A to 2D are diagrams for explaining the operation principle of the transistor according to the present invention (diagrams each showing an energy band of a semiconductor layer);

DETAILED DESCRIPTION OF THE PREFERRED EMBODIMENTS

Embodiment 1

In this embodiment, the operation principle of an n-channel transistor will be described as one embodiment of a transistor according to the present invention. Further, description will be made of a case where the operation principle is applied to a top gate type thin film transistor (TFT) in this embodiment.

Figure 1A:
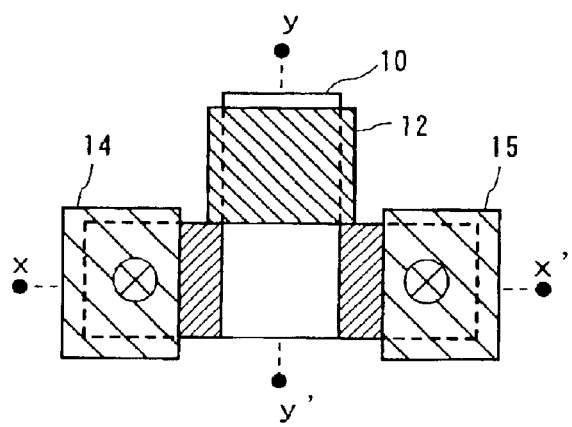
FIGS. 1A to 1D are diagrams for explaining a structure of a transistor according to the present invention (Embodiment 1)
Figure 1D:
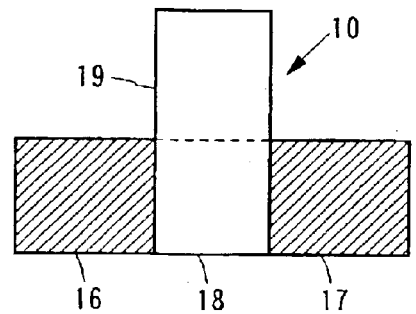
Figure 1B:
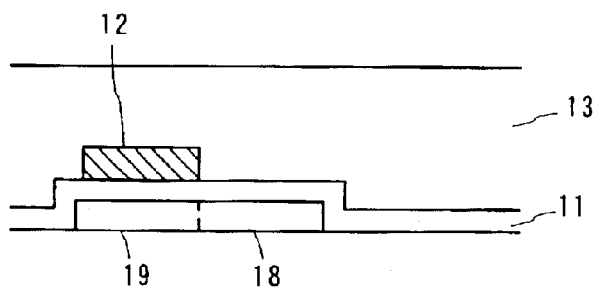
Figure 1C:
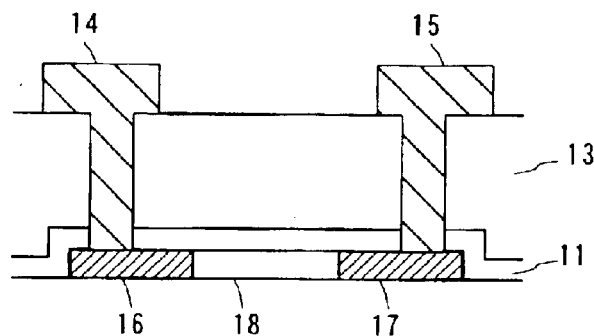

FIGS. 1A to 1D are diagrams showing a structure of an n-channel TFT. FIG. 1A is a top view of the thin film transistor; FIG. 1B is a sectional view taken along the line y–y' of FIG. 1A; FIG. 1C is a sectional view taken along the line x–x' of FIG. 1A; and FIG. 1D is a top view of a semiconductor layer formed of a semiconductor film.

(refer to FIG. 1B)

In the TFT in this embodiment, a semiconductor layer 10 which functions as a device and which is formed of a semiconductor film is provided, an insulating film 11 which functions as a gate insulating film is provided so as to be in close contact with the semiconductor layer 10, and a gate electrode 12 is provided so as to be in close contact with the insulating film 11.

(refer to FIG. 1C)

Further, an interlayer insulating film 13 is provided above the gate electrode 12, and a source electrode 14 and a drain electrode 15 are provided on the interlayer insulating film 13.

(refer to FIG. 1D)

An n-type source region 16 and an n-type drain region 17 are provided in the semiconductor layer 10. A channel region 18 is provided between the source region 16 and the drain region 17 so as to establish electrical conduction therebetween.

(refer to FIGS. 1A and 1C)

The source electrode 14 and the drain electrodes 15 are respectively connected with the source region 16 and the drain region 17 through contact holes provided in the interlayer insulating film 13.

(refer to FIG. 1D)

A region 19 that abuts with the channel region 18 is further provided in the semiconductor layer 10. The gate electrode 12 is provided through the insulating film 11 so as to be offset from and not to overlap with the channel region 18 and so as to overlap with the region 19.

The transistor in this embodiment can be manufactured by using a known technique of manufacturing a TFT.

The region 19 is a semiconductor region for forming an inversion layer (layer in which the electron concentration is high in the case of an n-channel transistor, or layer in which the hole concentration is high in the case of a p-channel transistor) due to an electric field generated by the gate electrode 12 to make the transistor conductive. Hereinafter, the semiconductor region is referred to as an inversion layer formation region.

In this embodiment, the conductivity type of the inversion layer formation region 19 is a p-type. The semiconductor conductivity types of the inversion layer formation region 19 and of the channel region 18 are explained later.

(refer to FIGS. 2A to 2D)

Next, the operation principle of the n-channel transistor shown in FIGS. 1A to 1D will be described using energy band diagrams of FIGS. 2A to 2D. Note that, in the energy band diagrams of FIGS. 2A to 2D, supposed is the case where the channel region 18 and the inversion layer formation region 19 have p-type conductivity and have the same carrier concentration, that is, match in the Fermi level.

In FIG. 2A, a diagram more schematically showing the y–y' sectional view is on the left side, and a diagram more schematically showing the x–x' sectional view is on the right side.

FIGS. 2B to 2D are each an energy band diagram of the semiconductor layer 10. In correspondence with FIG. 2A, the energy band of the y–y' section is on the left side, and the energy band of the x–x' section is on the right side.

Further, in each of the energy band diagrams of FIGS. 2B to 2D, a dash-dotted line indicates the Fermi level; a solid line above the dash-dotted line indicates the bottom of a conduction band; another solid line below the dash-dotted line indicates the peak of a valence band; and the space between the solid lines indicates a forbidden band. Further, the mark "circle" indicates an electron that is a carrier.

(refer to FIG. 2B)

FIG. 2B shows a thermal equilibrium state with a gate voltage Vg=0 V and a drain voltage Vd=0 V. In this state, the transistor is in a cut-off state. Since a barrier between the source region 16 and the channel region 18 is high, the carriers (electrons) cannot climb over the barrier. Thus, a drain current Id cannot flow.

(refer to FIG. 2C)

In order to make the current Id flow between the source region 16 and the drain region 17, a voltage equal to or more than a threshold voltage Vth is applied to the gate electrode as a gate voltage Vg. FIG. 2C shows the energy band immediately after the gate voltage Vg Vth>0 V and the drain voltage Vd>0 V are established.

When the voltage equal to or more than the threshold voltage Vth (>0 V) is applied to the gate electrode 12, electrons (carriers) are induced on the surface of the region 19 so that an inversion layer the electron concentration of which is high is formed. As a result, as shown in the left diagram of FIG. 2C, the electrons (carriers) move from the inversion layer formation region 19 to the channel region 18.

(refer to FIG. 2D)

The electron concentration of the conduction band of the channel region 18 becomes high along with the movement, and as shown in FIG. 2D, the bottom of the conduction band of the channel region 18 moves upward, and the Fermi level rises toward the conduction band. Theoretically; the electrons move from the inversion layer formation region 19 to the channel region 18 until the Fermi level of the channel region 18 matches with the Fermi level of the inversion layer formation region 19.

As shown in FIG. 2C, in the state in which a small quantity of electrons are injected to the channel region 18, the drain current Id hardly flows because the potential barrier between the source region 16 and the channel region 18 is high.

A quantity of electrons injected to the channel region 18 is increased, the Fermi level of the channel region 18 gets close to the conduction band, and then, the potential barrier between the source region 16 and the channel region 18 becomes low as shown in the right diagram of FIG. 2D. Thereafter, the drain current Id flows.

As described above, a semiconductor device in this embodiment operates as a transistor with control of the voltage Vg applied to the gate electrode.

Embodiment 2

In this embodiment, an n-channel thin film transistor will be described. This embodiment is a modification example of Embodiment 1.

Figure 3A:
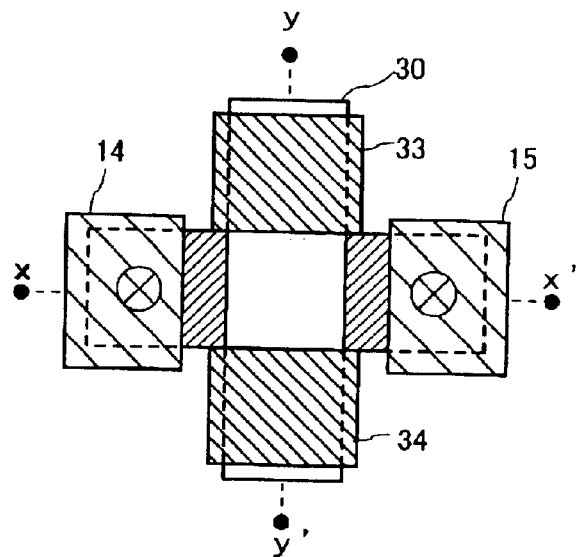
FIGS. 3A to 3D are diagrams for explaining a structure of a transistor according to the present invention (Embodiment 2)
Figure 3D:
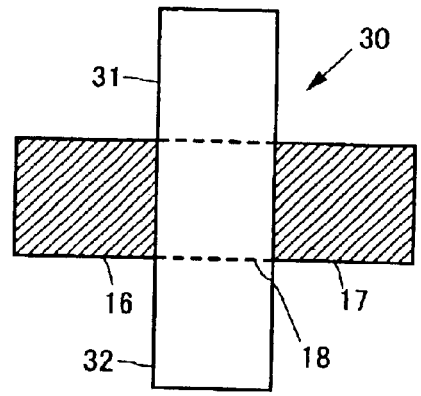
Figure 3B:
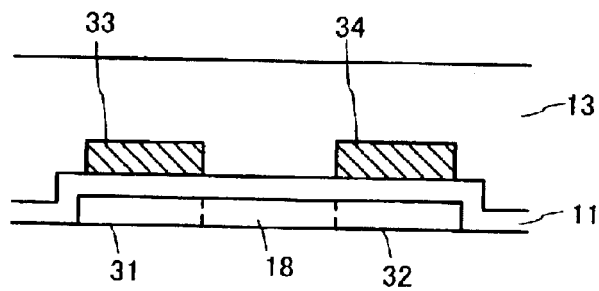
Figure 3C:
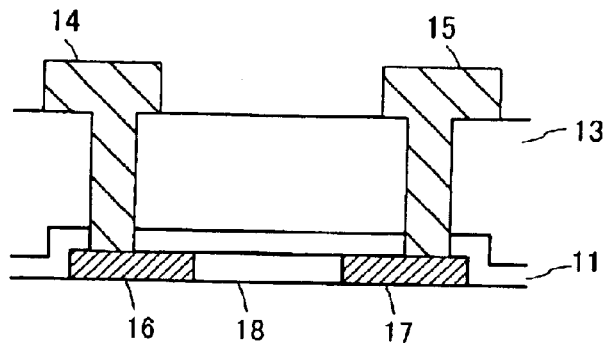

FIGS. 3A to 3D are diagrams showing a structure of the n-channel TFT. In FIGS. 3A to 3D, the same structural elements as those in FIGS. 1A to 1D are denoted by the same reference numerals. FIG. 3A is a top view of the thin film transistor; FIG. 3B is a sectional view taken along the y–y' line of FIG. 3A; FIG. 3C is a sectional view taken along the line x–x' of FIG. 3A; and FIG. 3D is a top view of a semiconductor layer formed of a semiconductor film.

(refer to FIG. 3D)

In this embodiment, p-type inversion layer formation regions 31 and 32 are provided so as to contact only with the p-channel region 18 in a semiconductor layer 30.

(refer to FIG. 3C)

This embodiment is the same as Embodiment 1 except the above-mentioned structure, and two gate electrodes 33 and 34 are provided correspondingly to the two inversion layer formation regions 31 and 32. The gate electrodes 33 and 34 are provided through the insulating film 11 so as to overlap with a pair of the inversion layer formation regions 31 and 32 and so as to be offset from and not to overlap with the channel region 18.

The transistor in this embodiment can also be manufactured by using a known technique of manufacturing a TFT.

The transistor in this embodiment has a structure in which the two inversion layer formation regions 31 and 32 are provided in the semiconductor layer 30 and a pair of the gate electrodes 33 and 34 is provided correspondingly to the two inversion layer formation regions 31 and 32, and has the same operation principle as that in Embodiment 1.

In this embodiment, electrons (carriers) are injected into the channel region 18 from the two inversion layer formation regions 31 and 32. Thus, there can be obtained faster the state in which electrical conduction is established between the source region 16 and the drain region 17 through the channel region 18 in comparison with Embodiment 1. Therefore, a cutoff frequency can be increased.

(Simulation Results of Transistors in Embodiments 1 and 2)

Figure 4:
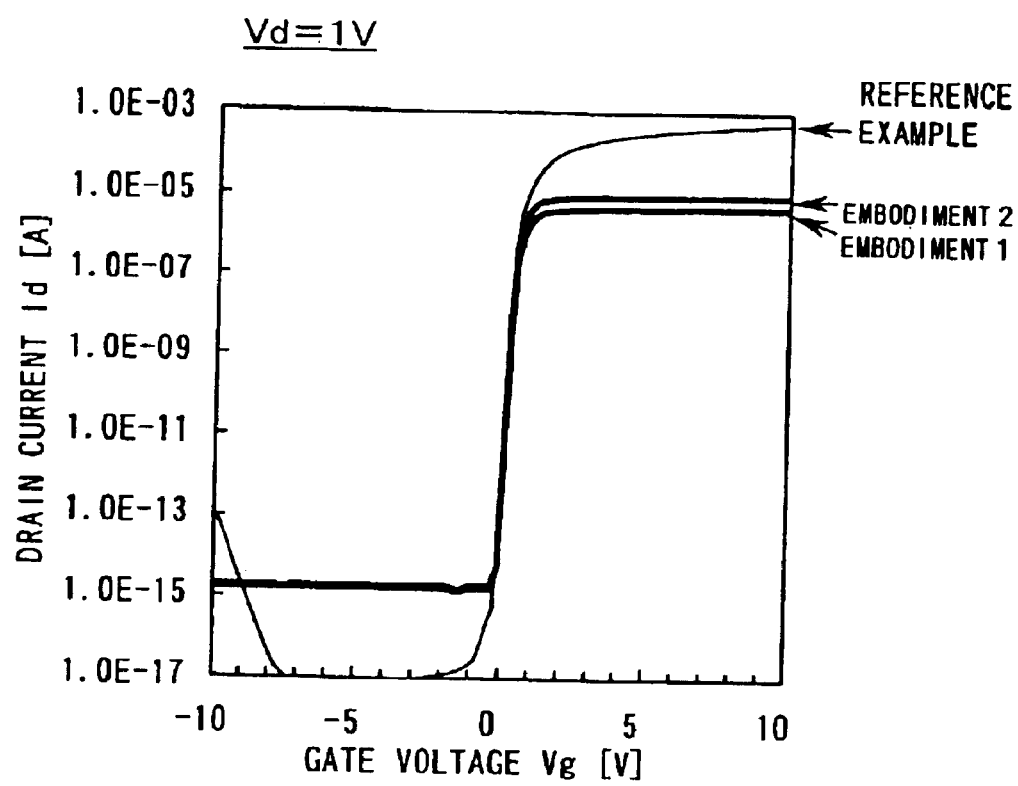
FIG. 4 is a diagram showing drain current-gate voltage characteristics of the transistor according to the present invention (theoretical calculation)

Characteristics of the n-type thin film transistors in Embodiments 1 and 2 are calculated based on theoretical calculation. FIG. 4 shows drain current Id-gate voltage Vg characteristics, and FIGS. 5A and 5B show drain current Id-drain voltage Vd characteristics.

Figure 5A:
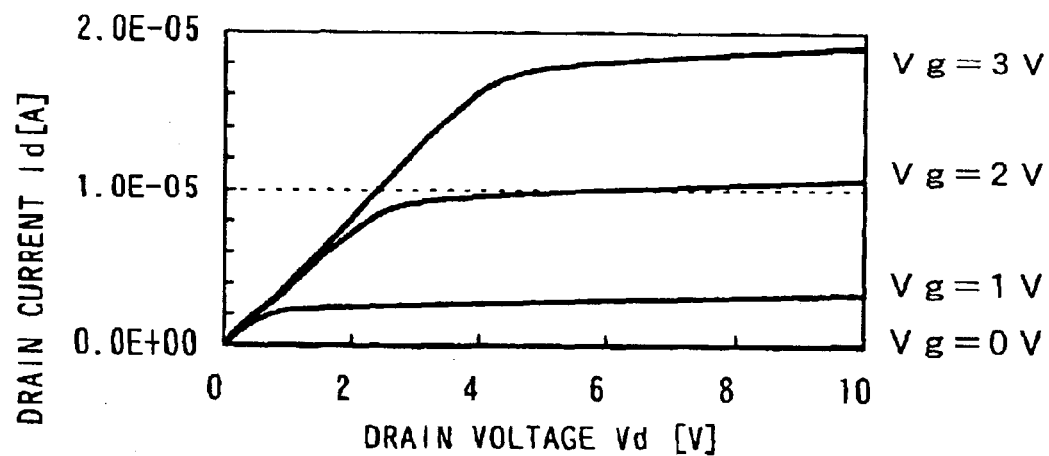
FIGS. 5A and 5B are diagrams each showing drain current-drain voltage characteristics of the transistor according to the present invention (theoretical calculation)
Figure 5B:
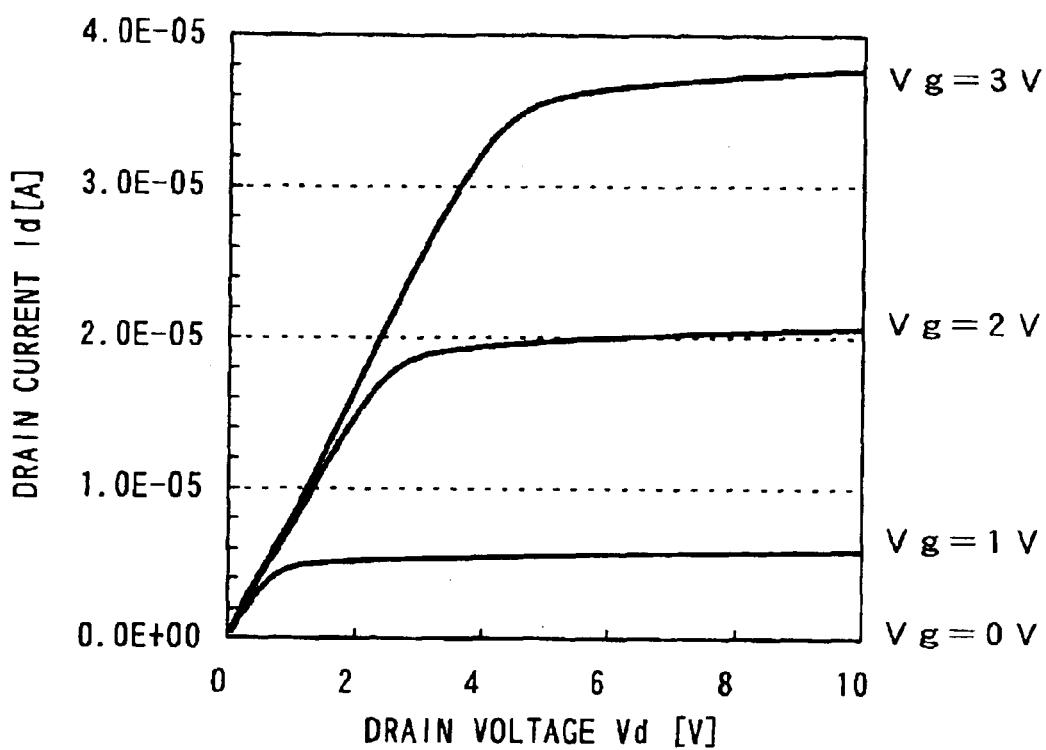

The characteristic curves of FIGS. 4, 5A and 5B show that the semiconductor devices in Embodiments 1 and 2 operate as transistors having an amplifying function and a switching function.

Note that the calculation soft TCAD GENESISe 7.0 produced by ISE Corp. is used for calculation of the characteristic curves of FIGS. 4, 5A and 5B. The conditions for the transistors are as follows:

Channel length L=5 ì m, channel width W=2 ì m;

The gate insulating film is formed of $SiO_2$ with a thickness $t_{ox}$ of 10 nm;

The semiconductor layer is formed of monocrystal Si with a thickness $t_{si}$ of 50 nm;

The channel region 18 and the inversion layer formation region 19 are regions made of monocrystal silicon which contains boron as a dopant at a concentration of $1 \times 10^{15}/cm^3$.

(refer to FIG. 4)

In FIG. 4, a reference example corresponds to a MOS type TFT with a conventional structure. The structure differs but the conditions are common among the reference example and Embodiments 1 and 2.

The Id-Vg characteristics of FIG. 4 fall on the case of a drain voltage Vd=1 V. The transistor according to the present invention has a characteristic that the change of the drain current Id with respect to the fluctuation of the gate voltage Vg in a saturation region is extremely small compared with a conventional field effect transistor. It is considered that the characteristic is obtained based on the following reason.

In the case of the n-channel transistor, the Fermi level in the inversion layer formation region hardly changes even though the gate voltage fluctuates at a voltage equal to or more than the threshold voltage Vth in the conductive state. That is, the height of the barrier between the source region and the channel region hardly depends on the gate voltage, and the drain current Id flows constantly with respect to the fluctuation of the gate voltage Vg.

Further, in the cut-off state as well, the Fermi level in the inversion layer formation region hardly changes even though the gate voltage Vg is made to fluctuate at a voltage equal to or less than the threshold voltage Vth. That is, the height of the barrier between the source region and the channel region does not fluctuate. Thus, an off current is almost constant also with respect to the fluctuation of the gate voltage.

On the contrary, the conventional field effect transistor is made to operate by making the height of the barrier of the channel fluctuate with the gate voltage. Therefore, under the operation principle, the current inevitably fluctuates when the voltage applied to a control electrode fluctuates. Thus, the drain current Id that flows through the transistor does not keep a constant value as shown in the reference example.

The same is equally true of a bipolar transistor. In the bipolar transistor, a voltage is applied to a base to change the Fermi level of the base so that a current is made to flow through the transistor. Thus, the current inevitably fluctuates when the base voltage fluctuates under the operation principle.

(refer to FIGS. 5A and 5B)

FIGS. 5A and 5B each show Id-Vd characteristic curves in the cases of a gate voltage Vg=0,1,2,3 V.

From the comparison of the Id-Vd characteristics between FIG. 5A and FIG. 5B, it is found that an on current about twice the on current of the transistor in Embodiment 1 flows through the transistor in Embodiment 2. It is considered that this is the effect obtained by providing two inversion layer formation regions in Embodiment 2.

Embodiment 3

This embodiment is an example in which the present invention is applied to an n-channel TFT, and is a modification example of Embodiment 1.

Figure 6A:
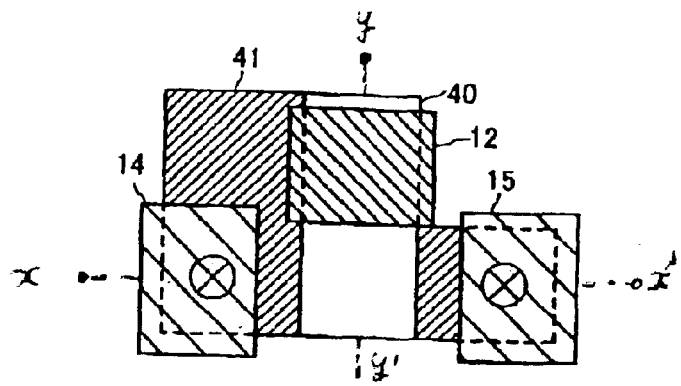
FIGS. 6A to 6D are diagrams for explaining a structure of a transistor according to the present invention (Embodiment 3).
Figure 6B:
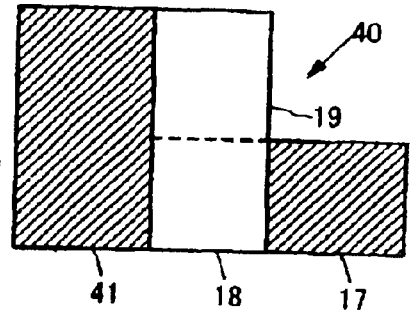

FIGS. 6A to 6D are diagrams showing a structure of the n-channel TFT. In FIGS. 6A to 6D, the same structural elements as those in FIGS. 1A to 1D are denoted by the same reference numerals. FIG. 6A is a top view of the thin film transistor, and FIG. 6B is a top view of a semiconductor layer 40 formed of a semiconductor film. A sectional view taken along the y–y' line is the same as FIG. 1C, and a sectional view taken along the line x–x' is the same as FIG. 1B.

As shown in FIG. 6B, this embodiment has a characteristic that an n-type source region 41 is provided so as to contact with the inversion layer formation region 19 in the semiconductor layer 40.

In this embodiment as well, the transistor can be manufactured by using a known technique of manufacturing a TFT.

Figure 6C:
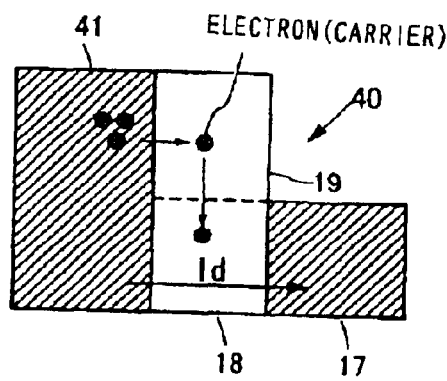

In order to establish electrical conduction of the transistor, voltages are applied to the gate electrode 12 and the drain electrode so as to satisfy a gate voltage Vg Vth>0 V and a drain voltage Vd>0 V. Then, an inversion layer is formed in the inversion layer formation region 19 as described in Embodiment 1. Thereafter, the barrier between the inversion layer formation region 19 and the source region 41 becomes low, and as shown in FIG. 6C, electrons (a large number of carriers in the source region) move from the source region 41 to the inversion layer formation region 19. Further, the electrons are injected into the channel region 18.

Along with the injection of carriers, the Fermi level of the channel region 18 rises, and the potential barrier between the source region 41 and the channel region 18 becomes low. Thus, the drain current Id flows.

This embodiment has a characteristic that although the electrons injected into the channel region 18 include the electrons induced to the inversion layer of the region 19, most of the electrons to be injected are supplied from the source region 41.

In Embodiments 1 and 2, the carriers (electrons) injected into the channel region 18 are only carriers that are electrostatically induced due to the electric field generated by the gate electrode. The carriers are induced by heat generation in the vicinity of an interface with the gate insulating film or through a defect level of a forbidden band.

Thus, since a certain period of time is required in order to induce the carriers, the present invention is limited to a cutoff frequency for the transistor. It is known with a monocrystal silicon wafer that the cutoff frequency capable of inducing electrons is 100 Hz or lower.

In this embodiment, the carriers (electrons) injected into the channel region 18 are a large number of carriers that originally exist in the n-type source region 41, and have not undergone the process of heat generation. Thus, it is expected that the cutoff frequency of the transistor is set on the order of MHz.

Figure 6D:
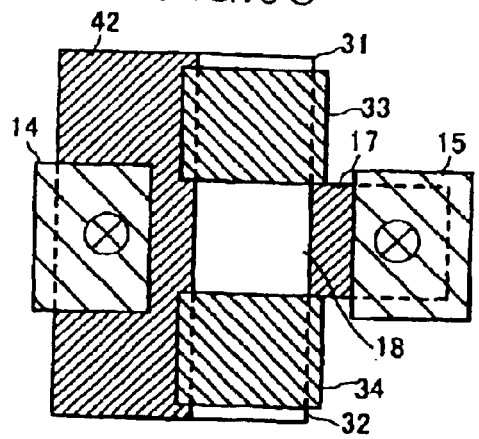

Note that this embodiment is described as the modification example of Embodiment 1; however, as shown in FIG. 6D, a source region 42 can be provided so as to contact with the two inversion layer formation regions 31 and 32 in the transistor in Embodiment 2 as well.

The n-channel transistor is described in Embodiments 1 to 3 described above. However, similarly to a known MOS transistor, in the case of a p-channel transistor, it is sufficient that an n-type semiconductor region is changed into a p-type semiconductor region and that the voltage to be applied to an electrode such as a gate electrode is inverted.

Further, supposed is the case where the channel region and the inversion layer formation region have the same conductivity type and the same concentration of carriers in Embodiments 1 to 3. However, the present invention is not limited to this case. When the common conductivity type and carrier concentration are adopted as described above, the control of the concentration of the dopant added into the semiconductor layer is conducted for two groups: a source region/drain region and a channel region/inversion layer formation region, as a result of which the process is simplified.

In the transistor according to the present invention, it is sufficient that the inversion layer having the same conductivity type as the source region/drain region is formed in the inversion layer formation region by controlling the voltage of the gate electrode. Therefore, as to the conductivity type of the inversion layer formation region, a p-type or i-type semiconductor region can be formed in the case of the n-channel transistor, and an n-type or i-type semiconductor region can be formed in the case of the p-channel transistor.

Further, the threshold voltage can be controlled in accordance with the dopant concentration of the inversion layer formation region. Thus, the dopant concentration of the inversion layer formation region may be determined so as to match with the threshold voltage.

On the other hand, as to the conductivity type of the channel region, a p-type semiconductor region is formed in the case of the n-channel transistor, and an n-type semiconductor region is formed in the case of the p-channel transistor. In the present invention, the height of the barrier between the channel region and the source region is determined in accordance with the dopant concentration of the channel region.

Therefore, when the channel region is formed of an i-type (intrinsic) semiconductor, there is a fear of occurrence of punch through. Thus, it is preferable that the channel region is set to have the opposite conductivity to that of the source region/drain region as described above in order to avoid the problem of punch through.

However, the drain current becomes more difficult to flow as the dopant concentration of the channel region is increased more, and thus, the dopant concentration of the channel region is set in line with the purpose for the usage of the transistor. For example, when the dopant concentration (electron concentration in the case of the n-channel transistor) of the source region/drain region is approximately $10^{19}$ to $10^{21}/cm^3$, the dopant concentration (hole concentration in the case of the n-channel transistor) of the channel region is preferably $1\times10^{14}$ to $1\times10^{17}/cm^{13}$.

Further, as to the transistor according to the present invention, limitation is not placed to the shape or structure shown in the figures in accordance with Embodiments 1 to 3, of course. For example, in each of the embodiments, each of the gate electrode, the source electrode, and the drain electrode is appropriately connected to the wiring for controlling a voltage and taking out electric power.

Moreover, description is made of the case where the present invention is applied to a top gate thin film transistor in Embodiments 1 to 3 described above. However, the present invention can also be applied to a thin film transistor with another structure, such as an inverted stagger TFT. In addition, the present invention can also be applied to a MOS transistor using a silicon wafer.

Further, a dual gate structure may be adopted in which gate electrodes are provided above and below an inversion layer formation region through an insulating film. In this case, inversion layers can be formed on both an upper surface and a lower surface of the inversion layer formation region, and thus, an on current can be increased.

Further, the transistor according to the present invention can apply structures of known and various transistors. For example, for the source region or the drain region, not only a single drain structure as described in the above embodiments but also an LDD structure for manufacturing a high-resistance transistor can be adopted.

Moreover, the transistor according to the present invention can be manufactured by using a known technique of manufacturing a MOS transistor, a thin film transistor, or the like. Thus, the existing manufacturing equipment itself can be used.

The transistor according to the present invention can operate without applying the voltage to the channel region via the gate electrode. Differently from the conventional field effect transistor, in the transistor according to the present invention, the change of the gate electrode does not directly influence the fluctuation of the Fermi level of the channel region. Thus, the current that flows between the source and the drain can be kept constant even though the gate voltage is changed.

Furthermore, in the transistor according to the present invention, the drain current flows without generating in the channel region the electric field perpendicular to the moving direction of carriers. Thus, deterioration due to hot carrier injection can be suppressed, and the change with time (deterioration) of the characteristics of the transistor can be suppressed.

Furthermore, the transistor according to the present invention can be used for fabricating active matrix liquid crystal display devices, EL display devices and the sensor that is operated by the constant current and the like because of the effect of above description

What is claimed is:

1. A transistor comprising:
    a semiconductor layer including a channel region, a source region, and a drain region;
    an insulating film that contacts the semiconductor layer; and
    a gate electrode adjacent to the semiconductor layer with the insulating film interposed therebetween, wherein:
        a semiconductor region that contacts the channel region is provided in the semiconductor layer; and
        the gate electrode is provided over the insulating film so as to overlap with the semiconductor region that contacts the channel region, and so as not to overlap with the channel region.

2. A transistor comprising:
    a semiconductor layer including a channel region, a source region, and a drain region;
    an insulating film that contacts the semiconductor layer; and
    a gate electrode adjacent to the semiconductor layer with the insulating film interposed therebetween, wherein:
        a semiconductor region that contacts the channel region and the source region is provided in the semiconductor layer; and
        the gate electrode is provide over the insulating film so as to overlap with the semiconductor region that contacts the channel region and the source region, and so as not to overlap with the channel region.

3. A transistor according to claim 1, wherein the semiconductor region that contacts the channel region has an i-type conductivity or an opposite conductivity to that of the source region and drain region.

4. A transistor according to claim 2, wherein the semiconductor region that contacts the channel region and the source region has an i-type conductivity or an opposite conductivity to that of the source region and drain region.

5. A transistor according to claim 1, wherein the channel region has an opposite conductivity to that of the source region and drain region.

6. A transistor according to claim 2, wherein the channel region has an opposite conductivity to that of the source region and drain region.

7. A transistor comprising:
    a semiconductor layer including a channel region, a source region, a drain region, and at least one inversion layer formation region;
    an insulating film formed over the semiconductor layer; and
    at least one gate electrode overlapped with the inversion layer formation region over the insulating film,
    wherein the inversion layer formation region contacts the channel region, and
    wherein the gate electrode is provided so as not to overlap with the channel region.

8. A transistor comprising:
    a semiconductor layer including a channel region, a source region, a drain region, and at least one inversion layer formation region;
    an insulating film formed over the semiconductor layer; and
    at least one gate electrode overlapped with the inversion layer formation region over the insulating film,
    wherein the inversion layer formation region contacts the channel region and the source region; and
    wherein the gate electrode is provided so as not to overlap with the channel region.

9. A transistor according to claim 7, wherein the inversion layer formation region that contacts the channel region has an i-type conductivity or an opposite conductivity to that of the source region and drain region.

10. A transistor according to claim 8, wherein the inversion layer formation region that contacts the channel region and the source region has an i-type conductivity or an opposite conductivity to that of the source region and drain region.

11. A transistor according to claim 7, wherein the channel region has an opposite conductivity to that of the source region and drain region.

12. A transistor according to claim 8, wherein the channel region has an opposite conductivity to that of the source region and drain region.

* * * * *